(12) United States Patent
Tanaka et al.

(10) Patent No.: US 11,453,098 B2
(45) Date of Patent: Sep. 27, 2022

(54) CARRIER FOR DOUBLE-SIDE POLISHING APPARATUS, DOUBLE-SIDE POLISHING APPARATUS, AND DOUBLE-SIDE POLISHING METHOD

(71) Applicant: SHIN-ETSU HANDOTAI CO., LTD., Tokyo (JP)

(72) Inventors: Yuki Tanaka, Nishigo-mura (JP); Daichi Kitazume, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 522 days.

(21) Appl. No.: 16/462,599

(22) PCT Filed: Nov. 10, 2017

(86) PCT No.: PCT/JP2017/040503
§ 371 (c)(1),
(2) Date: May 21, 2019

(87) PCT Pub. No.: WO2018/105306
PCT Pub. Date: Jun. 14, 2018

(65) Prior Publication Data
US 2020/0061772 A1 Feb. 27, 2020

(30) Foreign Application Priority Data

Dec. 9, 2016 (JP) .............................. JP2016-239174

(51) Int. Cl.
*B24B 37/08* (2012.01)
*B24B 37/28* (2012.01)
(Continued)

(52) U.S. Cl.
CPC .............. *B24B 37/08* (2013.01); *B24B 37/28* (2013.01); *H01L 21/304* (2013.01); *H01L 21/67092* (2013.01)

(58) Field of Classification Search
CPC ......... B24B 37/08; B24B 37/28; B24B 37/27; Y10T 442/2992; H01L 21/02024; H01L 21/304; H01L 21/67092
(Continued)

(56) References Cited

U.S. PATENT DOCUMENTS 6,291,373 B1* 9/2001 Sakaguchi .............. B24B 37/28
442/158
2008/0233840 A1* 9/2008 Pietsch ................... B24B 37/28
451/41

(Continued)

FOREIGN PATENT DOCUMENTS

JP 2011-97055 A 5/2011
JP 2013-132744 A 7/2013
(Continued)

OTHER PUBLICATIONS

Jan. 30, 2018 Search Report issued in International Patent Application No. PCT/JP2017/040503.
Sep. 10, 2021 Office Action issued in Korean Patent Application No. 10-2019-7016177.

*Primary Examiner* — Joseph J Hail
*Assistant Examiner* — Arman Milanian
(74) *Attorney, Agent, or Firm* — Oliff PLC

(57) ABSTRACT

A carrier for a double-side polishing apparatus configured to double-side polish providing a semiconductor silicon wafer. The carrier being disposed between upper and lower turn tables have a polishing pad attached, and includes a holding hole formed to hold the semiconductor silicon wafer between the upper and lower turn tables during polishing. The carrier for a double-side polishing apparatus is made of a resin. An average contact angle with pure water of front and back surfaces of the carrier, which come into contact with the polishing pads, is 45° or more and 60° or less, and a difference in average contact angles between the front (Continued)

surface and the back surface is 5° or less, which provides a carrier for a double-side polishing apparatus capable of enhancing the polishing rate for a semiconductor silicon wafer by using a resinous carrier; and a double-side polishing apparatus and method which employ the carrier.

6 Claims, 3 Drawing Sheets

(51) Int. Cl.
    *H01L 21/304*     (2006.01)
    *H01L 21/67*     (2006.01)

(58) Field of Classification Search
    USPC .................................. 451/269, 364; 442/180
    See application file for complete search history.

(56) References Cited

U.S. PATENT DOCUMENTS

| | | |
|---|---|---|
| 2011/0097975 A1 | 4/2011 | Schwandner et al. |
| 2013/0337723 A1 | 12/2013 | Tanimoto et al. |
| 2015/0050868 A1* | 2/2015 | Taketani ................. B24B 41/06 |
| | | 451/364 |

FOREIGN PATENT DOCUMENTS

| | | |
|---|---|---|
| JP | 2014-166677 A | 9/2014 |
| JP | 2015-009315 A | 1/2015 |
| JP | 2015-123553 A | 7/2015 |
| JP | 5834331 B1 | 12/2015 |
| WO | WO-2015170556 A1 * | 11/2015 ............. B24B 37/28 |

* cited by examiner

[FIG. 1]
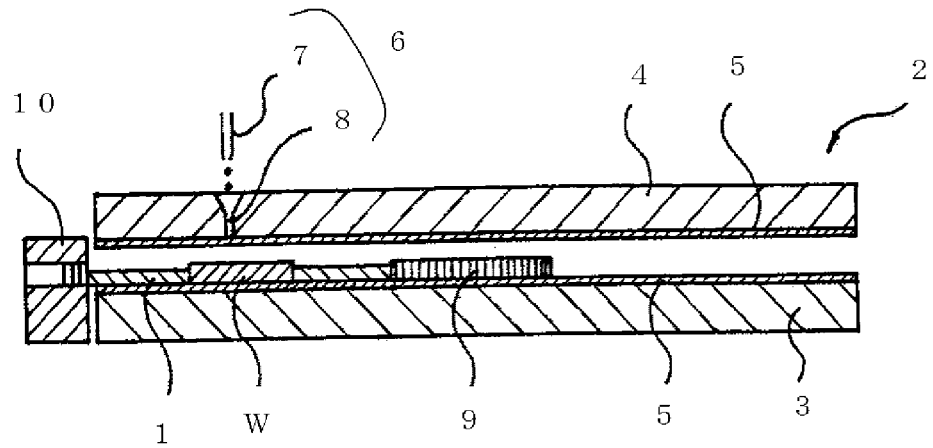
[FIG. 2]
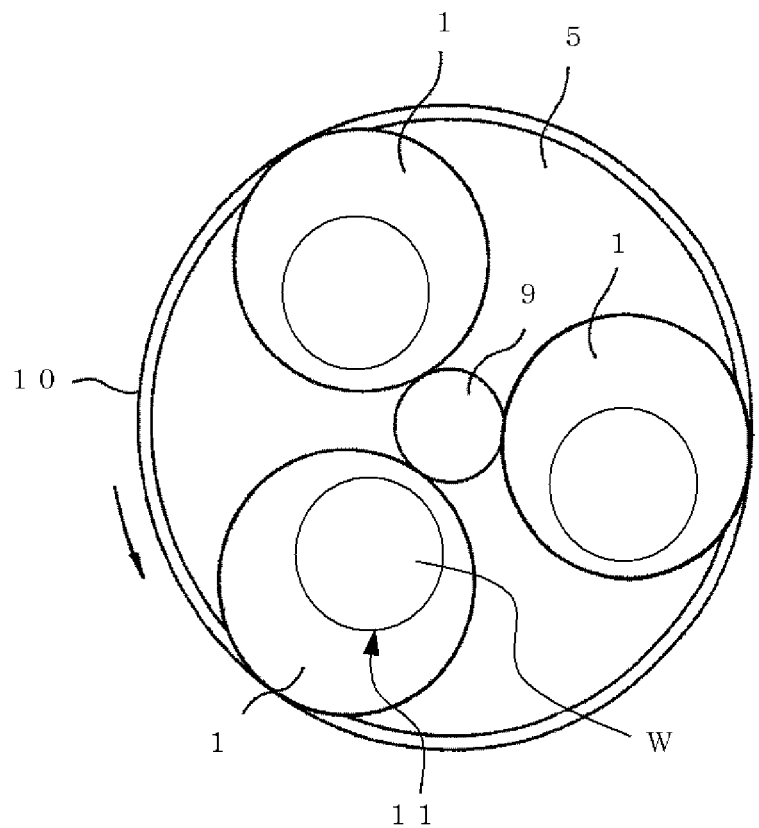

[FIG. 3]
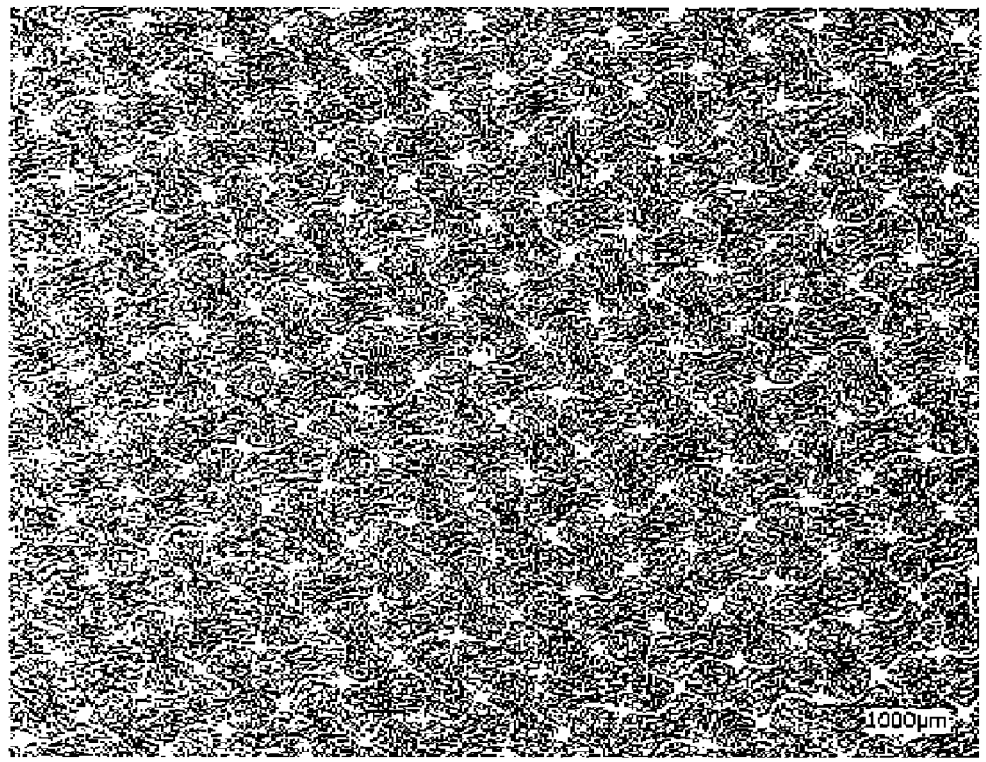
[FIG. 4]
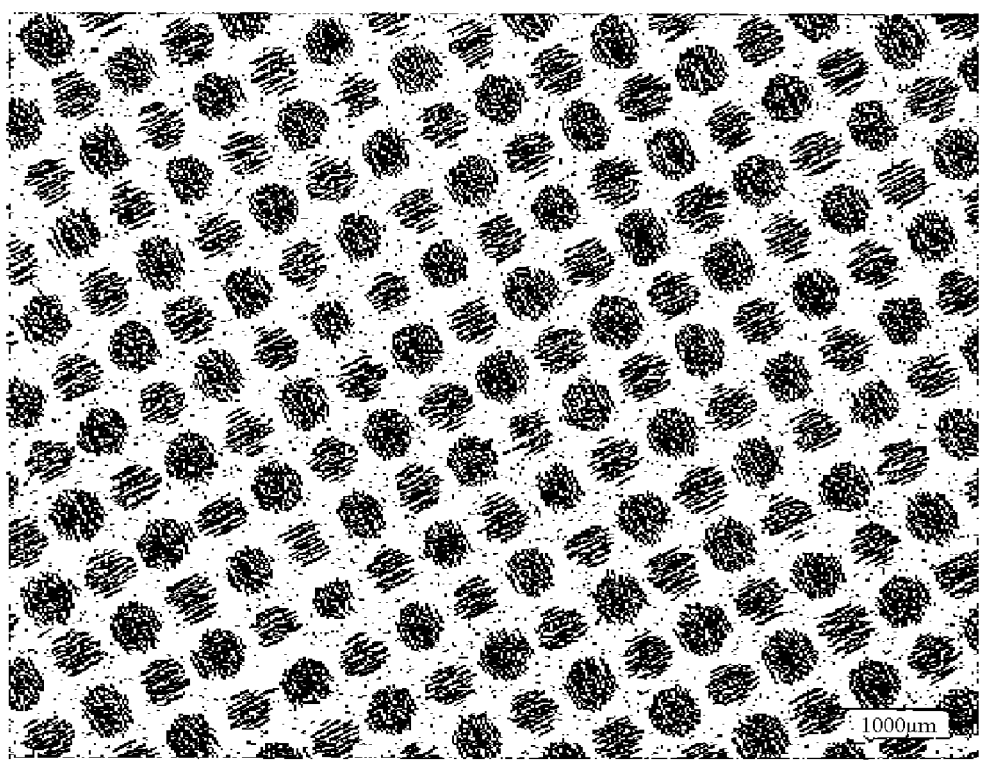

[FIG. 5]
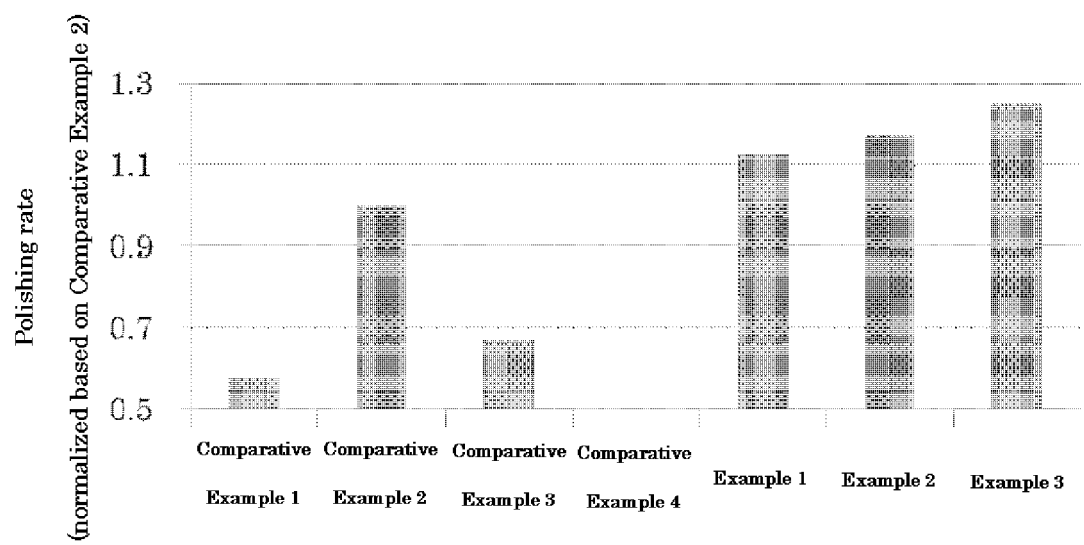

CARRIER FOR DOUBLE-SIDE POLISHING APPARATUS, DOUBLE-SIDE POLISHING APPARATUS, AND DOUBLE-SIDE POLISHING METHOD

TECHNICAL FIELD

The present invention relates to: a carrier for a double-side polishing apparatus to hold a semiconductor silicon wafer when the semiconductor silicon wafer is double-side polished; and a double-side polishing apparatus and a double-side polishing method which employ this carrier.

BACKGROUND ART

When both surfaces of a semiconductor silicon wafer (hereinafter, also referred to as simply silicon wafer or wafer) are simultaneously polished by a polishing process or the like, the wafer is held with a carrier for a double-side polishing apparatus. Such a carrier for a double-side polishing apparatus is formed to have a thickness smaller than that of the wafer, and includes a holding hole to hold a wafer. The wafer is inserted and held in the holding hole, and this carrier is disposed at a predetermined position between an upper turn table and a lower turn table of the double-side polishing apparatus. After polishing pads are attached to these upper and lower turn tables, upper and lower surfaces of the wafer are sandwiched therebetween, and double-side polishing is performed while a polishing agent (slurry) is being supplied between the upper and lower turn tables (Patent Document 1).

There are various types of carriers for a double-side polishing apparatus as described above, in accordance with the substrate material, design, and surface condition (such as covering and roughness).

Above all, carriers with resin substrates (resinous carriers) have such advantages as light weight, low cost, and simple structure because their holding holes require no insert for protecting a circumferential portion of a wafer unlike carriers with metal substrates (metallic carriers).

CITATION LIST

Patent Literature

Patent Document 1: Japanese Unexamined Patent publication (Kokai) No. 2015-123553

SUMMARY OF INVENTION

Technical Problem

However, resinous carriers are, on the other hand, inferior to metallic carriers in the polishing rate for wafers by about 40%, and have a problem with productivity for double-side polished wafers.

The present invention has been made in view of the above-described problem. An object of the present invention is to provide: a carrier for a double-side polishing apparatus capable of enhancing the polishing rate for a semiconductor silicon wafer by using a resinous carrier; and a double-side polishing apparatus and a double-side polishing method which employ the carrier.

Solution to Problem

To achieve the object, the present invention provides a carrier for a double-side polishing apparatus configured to double-side polish a semiconductor silicon wafer, the carrier being disposed between upper and lower turn tables each having a polishing pad attached thereto, and comprising a holding hole formed therein to hold the semiconductor silicon wafer sandwiched between the upper and lower turn tables during polishing, wherein the carrier for a double-side polishing apparatus is made of a resin, an average contact angle with pure water of front and back surfaces of the carrier, which come into contact with the polishing pads, is 45° or more and 60° or less, and a difference in average contact angles between the front surface and the back surface is 5° or less.

Such a carrier for a double-side polishing apparatus is capable of remarkably enhancing the polishing rate in double-side polishing a semiconductor silicon wafer held by the carrier in comparison with a case of employing a conventional resinous carrier for a double-side polishing apparatus, so that the productivity for the double-side polished wafer can be increased.

Moreover, the resinous carrier for a double-side polishing apparatus can be a resin stacked plate, and the resin stacked plate has a hydrophilic fibrous base material impregnated with a resin.

As resinous carriers for a double-side polishing apparatus, resin stacked plates having resin-impregnated fibrous base materials are commonly used. Hence, the present invention enables the manufacturing by employing conventionally-used materials, and is easily preparable. Additionally, the use of such a hydrophilic fibrous base material facilitates formation of hydrophilic surfaces having such contact angles with pure water as described above.

Moreover, the hydrophilic fibrous base material of the resin stacked plate may have an exposed surface ratio of 50% or more.

Such a configuration allows the front and back surfaces of the carrier for a double-side polishing apparatus to more surely satisfy the conditions of the contact angles with pure water as described above.

Further, the present invention provides a double-side polishing apparatus comprising:

upper and lower turn tables each having a polishing pad attached thereto;

a slurry supply mechanism configured to supply a slurry between the upper and lower turn tables; and a carrier for the double-side polishing apparatus, the carrier being disposed between the upper and lower turn tables and comprising a holding hole formed therein to hold a semiconductor silicon wafer sandwiched between the upper and lower turn tables during polishing, wherein the carrier for the double-side polishing apparatus is the above-described inventive carrier for a double-side polishing apparatus.

Such a double-side polishing apparatus is capable of remarkably enhancing the polishing rate in double-side polishing a semiconductor silicon wafer in comparison with a case of employing a double-side polishing apparatus in which a conventional resinous carrier for a double-side polishing apparatus is disposed. This makes it possible to enhance the productivity of the double-side polished wafer.

Furthermore, the present invention provides a method for double-side polishing a semiconductor silicon wafer, the method comprising:

disposing the above-described inventive carrier for a double-side polishing apparatus between upper and lower turn tables each having a polishing pad attached thereto;

holding the semiconductor silicon wafer with a holding hole formed in the carrier for a double-side polishing apparatus; and performing the double-side polishing while supplying a slurry between the upper and lower turn tables.

Such a double-side polishing method makes it possible to remarkably enhance the polishing rate in comparison with conventional methods, and to enhance the productivity.

Advantageous Effects of Invention

As described above, the inventive carrier for a double-side polishing apparatus, the double-side polishing apparatus including the carrier, and the inventive double-side polishing method make it possible to remarkably enhance the polishing rate in comparison with the case of employing a conventional resinous carrier for a double-side polishing apparatus. Thus, the productivity can be increased.

BRIEF DESCRIPTION OF DRAWINGS

FIG. 1 is a longitudinal cross-sectional view showing an example of a carrier for a double-side polishing apparatus and a double-side polishing apparatus which are according to the present invention.

FIG. 2 is an internal structure diagram showing an example of the double-side polishing apparatus in a plan view.

FIG. 3 is an image taken to show an example of a surface of the resinous carrier (the inventive carrier).

FIG. 4 is an image taken to show another example of a surface of a resinous carrier (conventional carrier).

FIG. 5 is a graph for comparing the polishing rates of Examples and Comparative Examples.

DESCRIPTION OF EMBODIMENTS

To solve the above problem, the present inventors have earnestly studied and found out that the hydrophilicity on the surface of a resinous carrier contributes to the polishing rate for a semiconductor silicon wafer.

The present inventors have quantified the hydrophilicity by measuring contact angles to pure water. Thus, the inventors have found that when an average contact angle of front and back surfaces of a carrier is 45° or more and 60° or less and a difference in average contact angles between the front surface and the back surface is 5° or less, the polishing rate for a wafer can be significantly enhanced. These findings have led to the completion of the present invention.

Hereinafter, embodiments of the present invention will be described with reference to the drawings. However, the present invention is not limited thereto.

FIG. 1 is a longitudinal cross-sectional view of an example of a double-side polishing apparatus of the present invention including a carrier for a double-side polishing apparatus of the present invention. FIG. 2 is an internal structure diagram of the double-side polishing apparatus in a plan view.

As shown in FIGS. 1 and 2, a double-side polishing apparatus 2 of the present invention including a carrier 1 for a double-side polishing apparatus (hereinafter also referred to as simply carrier) of the present invention includes a lower turn table 3 and an upper turn table 4 provided to face each other in a vertical direction, and polishing pads 5 are respectively attached to the opposed surfaces of the turn tables 3 and 4. As the polishing pads 5, for example, foamed polyurethane pads can be used.

Moreover, a slurry supply mechanism 6 (a nozzle 7 and a through hole 8 in the upper turn table 4) configured to supply a slurry between the upper turn table 4 and the lower turn table 3 is provided at an upper portion of the upper turn table 4. As the slurry, an aqueous inorganic alkaline solution containing colloidal silica can be used.

Further, a sun gear 9 is provided at a central portion between the upper turn table 4 and the lower turn table 3; at a circumferential portion therebetween an internal gear 10 is provided. Thus, the embodiment shown in FIGS. 1 and 2 is a 4-way type double-side polishing apparatus.

Note that the inventive double-side polishing apparatus is not limited to such a planetary gear type, and can also be an oscillation type.

A semiconductor silicon wafer W is held with a holding hole 11 in the carrier 1 and sandwiched between the upper turn table 4 and the lower turn table 3.

This carrier 1 is made of a resin. An average contact angle with pure water of front and back surfaces of the carrier 1, which come into contact with the polishing pads 5, is 45° or more and 60° or less, and a difference in average contact angles between the front surface and the back surface is 5° or less. The inventive carrier 1 satisfies the contact angle conditions as described above. This makes it possible to significantly enhance the polishing rate for the wafer W in comparison with a case of employing a conventional resinous carrier. The polishing rate can be enhanced by, for example, 10% or more, further 25% or more, or more than these. Depending on a conventional carrier to be compared, the present invention can also make the polishing rate double or more. As a result, the productivity for double-side polished wafers can be significantly increased.

Incidentally, for the contact angle measurement of the carrier, for example, PCA-11 manufactured by Kyowa Interface Science Co., Ltd. can be used. In the measurement, for example, 2.0 µL drops of pure water are dropped at five locations on each surface, and the contact angles are determined by image analysis. Their average value can be regarded as an average value of the single surface. Further, when the front and back surfaces are considered, an average value and a difference thereof can be calculated from an average value of the front surface and an average value of the back surface. Nevertheless, the contact angle measurement method is not limited thereto, and can be determined each time. As necessary, the measurement can be performed not at five locations but at more locations (or fewer locations) to obtain an average value.

Additionally, the carrier 1 should be made of a resin that at least satisfies the aforementioned predetermined contact angle conditions. Other than that, the constituent material is not particularly limited.

More preferably, the carrier 1 is a resin stacked plate. As an example of the constituent material, it is possible to use a composite material (FRP) in which a hydrophilic fibrous base material is impregnated with a resin. Examples of the fibrous base material include glass, liquid crystal polymer, cellulose, and the like. Examples of the resin include epoxy, aramid, phenol, and the like. These materials per se have been commonly used heretofore, and can be easily prepared to manufacture the carrier 1. Nevertheless, in the present invention, the hydrophilicity of the front and back surfaces are adjusted. These materials facilitate formation of the carrier having surfaces with appropriate hydrophilicity, and are effective in satisfying the contact angle conditions.

Note that when the hydrophilic fibrous base material of the resin stacked plate has an exposed surface ratio of 50% or more, the aforementioned contact angle conditions can be more surely satisfied. Particularly preferably, the exposed surface ratio of the fibrous base material is 50% or more on both the front surface and the back surface of the carrier 1. Nevertheless, the present invention is not limited thereto as a matter of course. The exposed surface ratio of the fibrous base material can be adjusted at will depending on the fibrous base material and the resin to be employed, and so on. The aforementioned contact angle conditions should be satisfied in the end.

In adjusting the exposed surface ratio of the hydrophilic fibrous base material within an appropriate range, the carrier can be polished for the adjustment under a more mechanical condition than that for actually polishing the wafer. For example, the polishing can be performed using foamed polyurethane pads as the polishing pads while a slurry containing silica abrasive grains is being supplied to thereby expose the fibrous base material.

Here, FIG. 3 shows an example of a surface when glass fibers were used as the hydrophilic fibrous base material and had a contact angle of 50.7° with pure water (the inventive carrier). An image of the surface of the carrier 1 was taken under a dark-field microscope. The black color indicates the glass fibers. The glass fibers have an exposed surface ratio of 67%.

Meanwhile, FIG. 4 shows an example when the contact angle is 66.8° (conventional carrier). In this case, the glass fibers have an exposed surface ratio of 36%.

Thus, the higher the ratio of the glass fibers exposed, the lower the contact angle.

In this manner, the contact angle is likely to vary depending on the exposed surface ratio of the hydrophilic fibrous base material. Thus, the carrier 1 satisfying the above contact angle conditions can be obtained by appropriately adjusting the exposed surface ratio each time.

Further, as shown in FIGS. 1 and 2, each tooth of the sun gear 9 and the internal gear 10 meshes with outer peripheral teeth of the carrier 1. When the upper turn table 4 and the lower turn table 3 are rotated by an unillustrated driving source, the carrier 1 rotates and revolves around the sun gear 9. In this event, the wafer W is held with the holding hole 11 in the carrier 1, and both surfaces are simultaneously polished by the upper and lower polishing pads 5. Note that, during the polishing, a slurry is supplied from the nozzle 7 through the through hole 8.

Such a double-side polishing apparatus includes the inventive carrier 1, greatly enhances the polishing rate for the wafer W, and can consequently enhance the productivity of double-side polished wafers.

Meanwhile, a double-side polishing method of the present invention includes: disposing the above-described inventive carrier for a double-side polishing apparatus between upper and lower turn tables each having a polishing pad attached thereto; holding the semiconductor silicon wafer with a holding hole formed in the carrier for a double-side polishing apparatus; and performing the double-side polishing while supplying a slurry between the upper and lower turn tables. This makes it possible to remarkably enhance the polishing rate and enhance the productivity in comparison with a case of double-side polishing employing a conventional carrier for a double-side polishing apparatus.

Specifically, for example, as shown in FIGS. 1 and 2, the wafer W is held in the holding hole 11 of the carrier 1. Next, the carrier 1 holding the wafer W is inserted between the upper and lower turn tables 3 and 4 of the double-side polishing apparatus 2. Then, while the slurry supply device 6 supplies a slurry to the surfaces to be polished, the carrier 1 is rotated and revolved with the upper and lower turn tables 3 and 4 rotating. In this manner, both surfaces of the wafer W are brought into sliding contact with the polishing pads 5, enabling the double-side polishing of the wafer W.

EXAMPLE

Hereinafter, the present invention will be specifically described with reference to Examples and Comparative Examples. However, the present invention is not limited thereto.

Examples 1 to 3

The inventive carriers for a double-side polishing apparatus were prepared such that each carrier had different contact angle conditions from the others. Then, the double-side polishing apparatus shown in FIG. 1 was prepared. A semiconductor silicon wafer held in the holding hole of one of the carriers for a double-side polishing apparatus was interposed between the upper and lower turn tables, and double-side polished while a slurry was being supplied.

After the double-side polishing, the wafer was cleaned. The polishing rate was calculated based on a difference in thicknesses before and after the polishing.

The polishing and measuring conditions were as follows.

As the wafers, P-type silicon single crystal wafers each having a diameter of 300 mm were used.

As the polishing apparatus, DSP-20B manufactured by Fujikoshi Machinery Corp. was used.

As the polishing pads, foamed polyurethane pads having Shore A hardness of 90 were used.

As the carriers, FRP was used in which glass fibers were impregnated with epoxy resin.

As the slurry, a KOH-based slurry was used which contained silica abrasive grains and had an average grain size of 35 nm, an abrasive-grain concentration of 1.0 wt %, and a pH of 10.5.

The machining load was set to 100 gf/cm$^2$.

The machining time was set such that the wafer thickness was flush with the carrier.

The rotation speed of each driving unit was set as follows: the upper turn table was −13.4 rpm, the lower turn table was 35 rpm, the sun gear was 25 rpm, and the internal gear was 7 rpm.

Dressing of the polishing pads was performed by bringing a dress plate having diamond abrasive grains electrodeposited thereon into sliding contact with the upper and lower polishing pads at a predetermined pressure while pure water flowed.

SC-1 cleaning was performed under a condition of $NH_4OH:H_2O_2:H_2O=1:1:15$.

The thickness differences of five wafers per batch before and after the treatments were measured with Nanometro (manufactured by Kuroda Precision industries Ltd.). An average value of the thickness differences of the five wafers was divided by the polishing time to determine the polishing rate.

For the contact angle measurement of the carriers, PCA-11 manufactured by Kyowa Interface Science Co., Ltd. was used. In the measurement, 2.0 µL drops of pure water were dropped at five locations on each surface, and the contact angles were determined by image analysis. Their average value was regarded as an average value of the single surface. Further, when the front and back surfaces were considered, an average value (Ave) and a difference (Dif) were calculated from an average value of the front surface and an average value of the back surface.

Comparative Examples 1 to 4

Conventional carriers for a double-side polishing apparatus were prepared which had contact angle conditions outside the range of the present invention.

Other than the carriers for a double-side polishing apparatus, the same double-side polishing apparatus as that in Examples was prepared, and semiconductor silicon wafers were double-side polished, cleaned, and the polishing rates were calculated in the same manner as in Examples.

Table 1 shows a summary of the carrier contact angle conditions and the polishing rates of Examples 1 to 3 and Comparative Examples 1 to 4. Moreover, FIG. 5 shows a graph regarding the polishing rates. Note that the polishing rates in both Table 1 and FIG. 5 were normalized based on the polishing rate of Comparative Example 2.

It should be noted that Examples 1 to 3 satisfied both of condition A, contact angle with respect to pure water: 45°≤Ave≤60°, and condition B: Dif≤5°. Comparative Examples 1 to 4 did not satisfy both of conditions A, B, or satisfied only one of them.

TABLE 1

|  |  | Comparative Example 1 | Comparative Example 2 | Comparative Example 3 | Comparative Example 4 | Example 1 | Example 2 | Example 3 |
|---|---|---|---|---|---|---|---|---|
| Contact angle | Ave | 69° | 64° | 55° | 42° | 60° | 53° | 45° |
|  | Dif | 9° | 3° | 7° | 2° | 3° | 5° | 2° |
| Condition | A | unsatisfied | unsatisfied | satisfied | unsatisfied | satisfied | satisfied | satisfied |
|  | B | unsatisfied | satisfied | unsatisfied | satisfied | satisfied | satisfied | satisfied |
| Polishing rate |  | 0.58 | 1.00 | 0.67 | 0.50 | 1.13 | 1.17 | 1.25 |

As shown in Table 1 and FIG. 5, in all of Examples 1 to 3 employing the carriers for a double-side polishing apparatus which satisfied both of the contact angle conditions A, B in the present invention and the double-side polishing apparatus, the polishing rates were successfully enhanced in comparison with Comparative Examples 1 to 4 employing the carriers for a double-side polishing apparatus which satisfied at most one of the contact angle conditions A, B in the present invention.

For example, in contrast to Comparative Example 2 served as the reference (polishing rate: 1.00), Example 1 was 1.13, which increased by 10% or more. Moreover, Example 3 was 1.25, which increased by as much as 25%. Furthermore, as can be seen from the comparison between Comparative Example 4 (0.50) and Example 3 (1.25), it was possible to obtain the polishing rate which was more than doubled.

The comparison between Examples and Comparative Examples indicates that the numerical values of the upper limit and the lower limit of the contact angle conditions in the present invention have criticality.

For example, in Comparative Example 4 (polishing rate: 0.50), the set of Ave and Dif is (42°, 2°), and that of Example 3 (1.25) is (45°, 2°). Thus, depending on whether Ave is 45° or more, the polishing rate can be dramatically enhanced.

Note that, in Comparative Example 4, wear was found when the used carrier for double-side apparatus was observed.

Moreover, as can be seen from the comparison between Comparative Example 2 (polishing rate: 1.00) (64°, 3°) and Example 1 (1.13) (60°, 3°), with Ave of 60° or less, the polishing rate was successfully enhanced by at least 1.1 times.

Further, as can be seen from the comparison between Comparative Example 3 (polishing rate: 0.67) (55°, 7°) and Example 2 (1.17) (53°, 5°), with Dif of 5° or less, the polishing rate was successfully enhanced by at least 1.7 times.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A carrier for a double-side polishing apparatus configured to double-side polish a semiconductor silicon wafer, the carrier being disposed between upper and lower turn tables each having a polishing pad attached thereto, and comprising a holding hole formed therein to hold the semiconductor silicon wafer sandwiched between the upper and lower turn tables during polishing, wherein
the carrier for a double-side polishing apparatus comprises a hydrophilic fibrous base material impregnated with a resin, the hydrophilic fibrous base material of the carrier having an exposed surface ratio of 50% or more,
an average contact angle with pure water of front and back surfaces of the carrier, which come into contact with the polishing pads, is 45° or more and 60° or less, and
a difference in average contact angles between the front surface and the back surface is 5° or less.

2. The carrier for a double-side polishing apparatus according to claim 1, wherein
the carrier is a resin-stacked plate.

3. A double-side polishing apparatus comprising:
upper and lower turn tables each having a polishing pad attached thereto;
a slurry supply mechanism configured to supply a slurry between the upper and lower turn tables; and
a carrier for the double-side polishing apparatus, the carrier being disposed between the upper and lower turn tables and comprising a holding hole formed therein to hold a semiconductor silicon wafer sandwiched between the upper and lower turn tables during polishing, wherein
the carrier for the double-side polishing apparatus is the carrier for a double-side polishing apparatus according to claim 1.

4. A double-side polishing apparatus comprising:
upper and lower turn tables each having a polishing pad attached thereto;
a slurry supply mechanism configured to supply a slurry between the upper and lower turn tables; and
a carrier for the double-side polishing apparatus, the carrier being disposed between the upper and lower turn tables and comprising a holding hole formed therein to hold a semiconductor silicon wafer sandwiched between the upper and lower turn tables during polishing, wherein the carrier for the double-side polishing apparatus is the carrier for a double-side polishing apparatus according to claim 2.

5. A method for double-side polishing a semiconductor silicon wafer, the method comprising:

disposing the carrier for a double-side polishing apparatus according to claim 1 between upper and lower turn tables each having a polishing pad attached thereto;

holding the semiconductor silicon wafer with a holding hole formed in the carrier for a double-side polishing apparatus; and performing the double-side polishing while supplying a slurry between the upper and lower turn tables.

6. A method for double-side polishing a semiconductor silicon wafer, the method comprising:

disposing the carrier for a double-side polishing apparatus according to claim 2 between upper and lower turn tables each having a polishing pad attached thereto;

holding the semiconductor silicon wafer with a holding hole formed in the carrier for a double-side polishing apparatus; and performing the double-side polishing while supplying a slurry between the upper and lower turn tables.

\* \* \* \* \*